Figure 1:
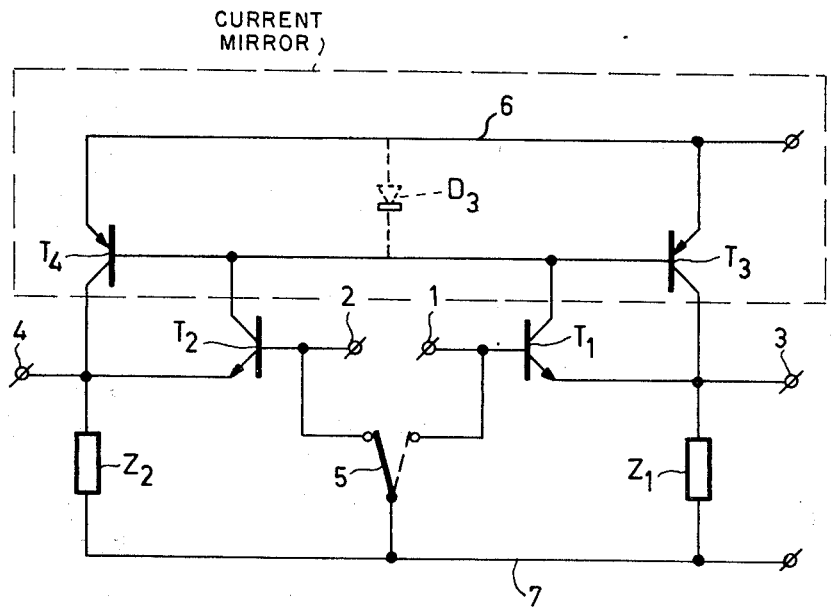

United States Patent [19]

Van Sluys

[11] 4,001,731
[45] Jan. 4, 1977

[54] DEVICE FOR OPTIONALLY REALIZING TWO MUTUALLY COMPLEMENTARY FUNCTIONS

[75] Inventor: Robert Nestor Joseph Van Sluys, Eindhoven, Netherlands

[73] Assignee: U.S. Philips Corporation, New York, N.Y.

[22] Filed: Oct. 2, 1975

[21] Appl. No.: 619,063

[30] Foreign Application Priority Data

Oct. 15, 1974 Netherlands .................. 7413514

[52] U.S. Cl. .................. 333/14; 307/264; 307/296; 330/29
[51] Int. Cl.² .................................. H03G 7/06
[58] Field of Search ............ 333/14; 307/229, 264, 307/313, 296; 328/168, 172; 330/29

[56] References Cited

UNITED STATES PATENTS 3,932,768  1/1976  Takahashi et al. ............ 307/264 X

*Primary Examiner*—Paul L. Gensler
*Attorney, Agent, or Firm*—Frank R. Trifari; Henry I. Steckler

[57] ABSTRACT

A switchable compression-expansion device, in which a first and a second impedance are included in the emitter circuits of two emitter followers. The impedances are also included in two isolated signal circuits which are coupled via a current mirror circuit. A selection means maintains one of the two emitter followers in the non-conducting state. The current which is produced in the associated impedance by the conducting emitter follower is coupled to the other impedance by the current mirror arrangement. In the other condition of the selection circuit the reverse occurs so that two complementary transfer functions are realized.

6 Claims, 4 Drawing Figures

DEVICE FOR OPTIONALLY REALIZING TWO MUTUALLY COMPLEMENTARY FUNCTIONS

The invention relates to a device for optionally realizing two mutually complementary transfer functions, in particular intended for dynamic noise reduction systems, comprising a first and a second impedance, a first and a second follower circuit for optionally applying an input voltage across the first and the second impedance respectively, and a selection means for optionally maintaining one of the two follower circuits in a conductive state.

Such a device is specifically intended as a compression-expansion circuit in dynamic noise reduction systems. If $Z_1$ is the first impedance and $Z_2$ the second impedance, $Z_1/Z_2$ for example being the expansion function and the inverse function thereof, $Z_2/Z_1$ being the compression function. A requirement with which such a device must comply is that the two functions should be complementary to the highest possible degree under dynamic operating conditions.

From U.S. Pat. Nos. 3,813,559 and 3,829,715, devices are known for realizing two mutually complementary functions. These known devices are based on the emitter-follower principle, one signal circuit including the series connection of the first impedance, the collector-emitter path of an emitter follower transistor and the second impedance. For switching over from expansion to compression function and vice versa the patents inter alia propose a device in which in one circuit includes the series connection of the first impedance, the collector-emitter path of either an npn emitter follower transistor or a pnp emitter-follower transistor and the second impedance, the npn or pnp emitter follower transistor being included in the circuit depending on the position of switches. If the npn emitter-follower transistor is included in the circuit, the first impedance is the collector impedance and the second impedance the emitter impedance of said transistor, the base electrode of said transistor being the input terminal and an output voltage being available across the first impedance. If the pnp emitter-follower transistor is included in the circuit, the first impedance is the emitter impedance and the second impedance the collector impedance of said transistor, the base electrode of said transistor being the input terminal and the output voltage being available across the second impedance.

Said known device has the drawback that the two functions have different dynamic properties because the dynamic properties of pnp-type and npn-type transistors are different. In addition, it is disadvantageous for the maximum signal level that the two impedances are included in series in the circuit. For each impedance substantially half the supply voltage is available, so that the dynamic range is halved relative to devices where for each impedance substantially the full supply voltage would be available.

It is an object of the invention to provide a device which in a simple manner realizes two mutually highly complementary functions and which does not have said drawbacks, and for this the invention is characterized in that the two impedances are included in two individual signal circuits and the device is provided with a current-mirror arrangement for selectively coupling the current which is produced in the associated impedance by the conducting follower circuit to the other impedance.

The object of the invention is achieved in that in the two optional conditions of the device a signal current flows through the same impedances and the same types of transistors.

It will be evident that owing to the use of a current mirror arrangement the device is in particular intended to take the form of an integrated circuit. Moreover, this has the advantage that the various transistors which are eligible for this can be made identical in a particularly satisfactory manner.

Figure 2:
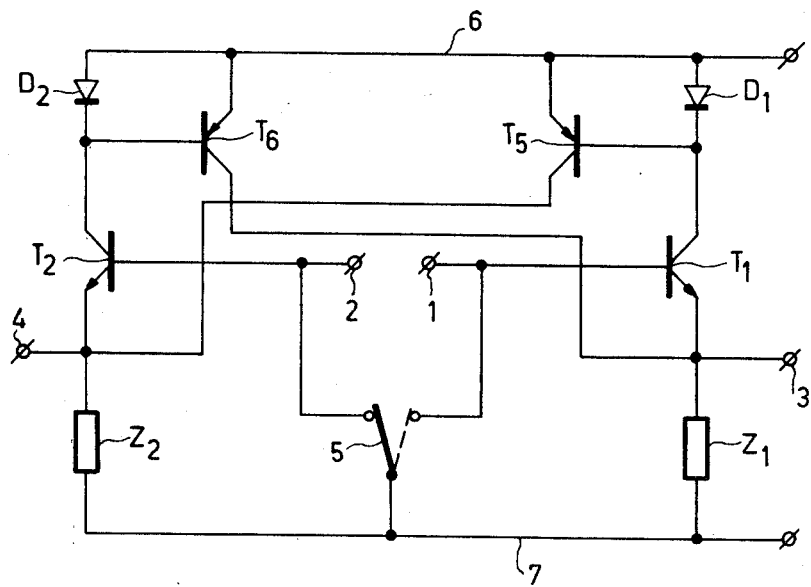
Figure 3:
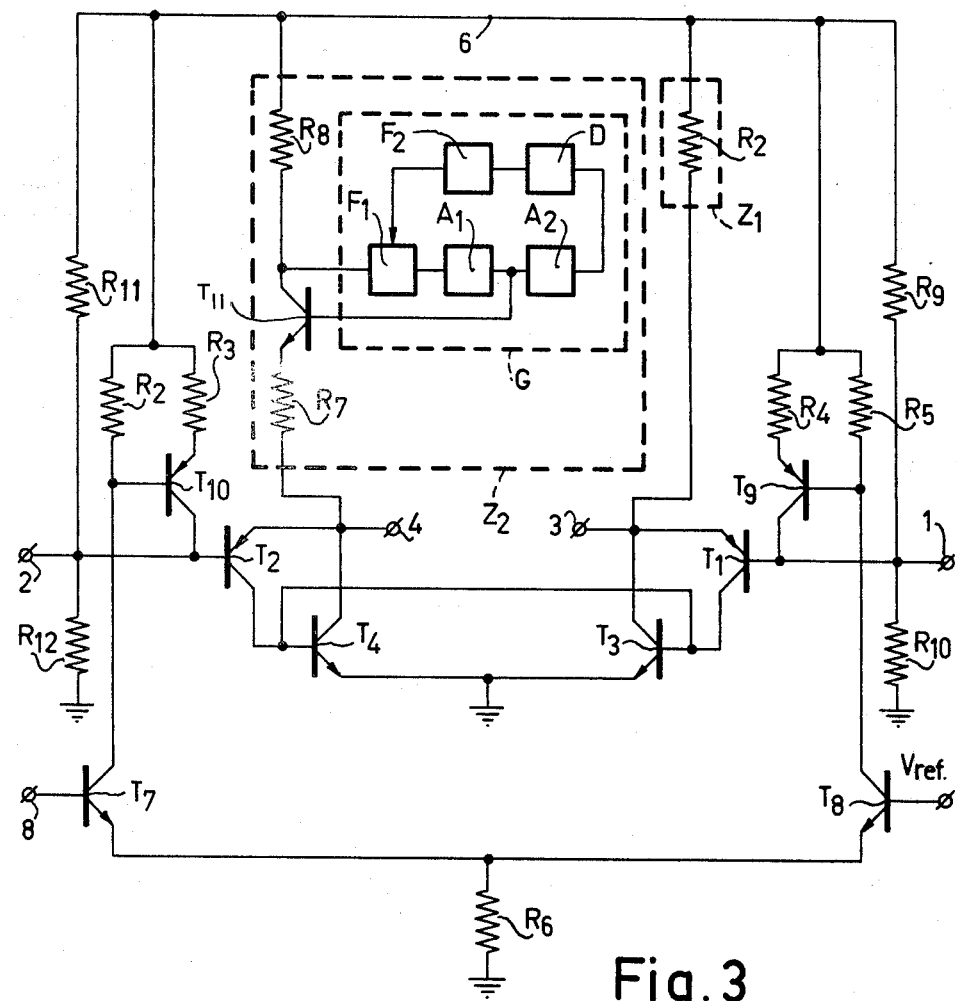
Figure 4:
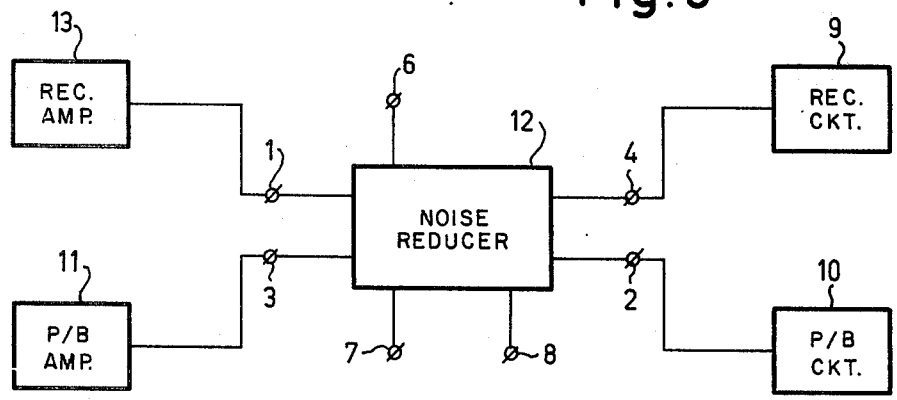

The invention will be described in more detail with reference to the drawing, in which FIG. 1 shows a first embodiment of a device according to the invention, FIG. 2 shows a second embodiment of a device according to the invention, FIG. 3 shows a third embodiment of a device according to the invention with electronic change-over, FIG. 4 schematically represents an example of an application of a device according to the invention.

The device of FIG. 1 comprises a first emitter-follower transistor $T_1$ and a second emitter-follower transistor $T_2$, both of the same conductivity type, in the present example of the npn type. The bases of the transistor $T_1$ and $T_2$ are respectively connected to a first input terminal 1 and a second input terminal 2. The emitters of the transistors $T_1$ and $T_2$ are connected to a first supply line 7 via the first impedance $Z_1$ and the second impedance $Z_2$ respectively, which supply line is for example the earth of the circuit. Moreover, the emitters of the transistors $T_1$ and $T_2$ are connected to a first output terminal 3 and a second output terminal 4 respectively. The collectors of the transistors $T_1$ and $T_2$ are connected to the bases of the transistors $T_3$ and $T_4$ respectively which are of a conductivity type opposite to the conductivity type of the transistors $T_1$ and $T_2$. The emitters of the transistors $T_3$ and $T_4$ are connected to a second supply line 6, whilst the transistors $T_3$ and $T_4$ form a current-mirror arrangement in that the bases are interconnected. As a result, the emitter currents of the transistors $T_3$ and $T_4$ are mutually coupled. The collectors of the transistors $T_3$ and $T_4$ are connected to the emitters of the transistors $T_1$ and $T_2$ respectively, so that the impedances $Z_1$ and $Z_2$ are included in two mutually isolated signal circuits, which are coupled in that the base-emitter junctions of the transistors $T_3$ and $T_4$ shunt each other. In order to keep one of the two emitter-follower transistors in the non-conducting state, the bases of the transistors $T_1$ and $T_2$ are connected to the terminals of a two-way switch 5, whose master contact is connected to the first supply line 7. Said switch 5 is preferably an electronic switch.

If the situation is as shown in FIG. 1, i.e. the base of transistor $T_2$ is connected to the supply line 7, transistor $T_2$ is non-conducting and carries no current. When a signal voltage $Vi_1$ is applied between the base of transistor $T_1$ and supply line 7, said signal voltage will almost fully appear across the impedance $Z_1$ owing to the emitter-follower action of transistor $T_1$ and a signal current equal to $Vi_1/Z_1$ will be produced in said impedance. Transistor $T_1$ then drives the bases of the current mirror transistors $T_3$ and $T_4$, so that said signal current can flow through the collector-emitter path of transistor $T_3$. If the device takes the form of an integrated circuit and the emitter areas of the transistors $T_3$ and $T_4$ are equal, an equal current will flow through the collector-emitter path of transistor $T_4$ owing to the current-mirror action. This current causes a voltage $Vu_1$ across the impedance $Z_2$, which voltage is available at the output terminal 4 and complies with the following equation:

$$vu_1 = (Z_2/Z_1) Vi_1 \quad (1)$$

At output terminal 3 an output voltage $Vu_2$ is then available for wich:

$$Vu_2 = Vi_1 \quad (2)$$

The inverse function of the transfer function (1) is realized when switch 5 is changed over and an input signal voltage $Vi_2$ between input terminal 2 and supply line 7. Said signal voltage $Vi_2$ will almost fully appear across the impedance $Z_2$ owing to the emitter follower action of transistor $T_2$ and will produce a signal current in said impedance which is equal to $Vi_2/Z_2$. Transistor $T_2$ then drives the base of the current-mirror transistors $T_3$ and $T_4$, so that said signal current can flow through the collector-emitter path of transistor $T_4$. If the device takes the form of an integrated circuit and the emitter areas of the transistors $T_3$ and $T_4$ are equal an equal current will flow through the collector-emitter path of transistor $T_4$ owing to the current-mirror action. This current causes a voltage $Vu_2$ across the impedance $Z_1$, which voltage is available at the output terminal 3 and which equals:

$$Vu_2 = (Z_1/Z_2)Vi_2 \quad (3)$$

At output terminal 4 an output voltage $Vu_1$ is then available for which:

$$Vu_1 = Vi_2 \quad (4)$$

It will be evident that the transfer function (1) and (3) are highly complementary in that in both optional conditions of the device signal current flows through the same types of transistors and the same impedances.

In principle, a satisfactorily operating device is also obtained if the base-emitter junctions of the transistors $T_3$ and $T_4$ are shunted by a diode or a transistor $D_3$ which is connected as a diode, as is shown dashed in FIG. 1. If the device takes the form of an integrated circuit and if the transistor $D_3$ which is connected as a diode is identical to the transistors $T_3$ and $T_4$, the currents which flow through the impedances $Z_1$ and $Z_2$ will be distributed uniformly among the collector-emitter paths of the transistors $T_1$, $T_3$ and $T_2$, $T_4$ respectively. The collector currents of the transistors $T_1$ and $T_2$ then flow almost fully through diode $D_3$. In an integrated circuit the transistors $T_3$ and $T_4$ and the diode $D_3$ will generally be formed by a lateral pnp transistor with triple collector, two collector electrodes being connected to the emitters of the transistors $T_1$ and $T_2$ and the third collector electrode being connected to the base of said lateral pnp transistor.

FIG. 2 shows an alternative embodiment of the device of FIG. 1, a different type of current mirror arrangement being employed. The device corresponds to the device of FIG. 1 except for the transistors $T_3$ and $T_4$, and the various corresponding elements are correspondingly numbered. The collectors of the emitter follower transistors $T_1$ and $T_2$ are then connected to the bases of the transistors $T_5$ and $T_6$ respectively, whose collectors are connected to the output terminals 4 and 3 respectively, and whose emitters are connected to the supply line 6. The transistors $T_5$ and $T_6$ are of a conductivity type opposite to the conductivity type of the transistors $T_1$ and $T_2$. The circuits in which the impedances $Z_1$ and $Z_2$ are included are mutually current-mirror coupled in that the base-emitter junctions of the transistors $T_5$ and $T_6$ are shunted by the diodes $D_1$ and $D_2$ respectively. In integrated circuits said diodes will generally be transistors whose bases are connected to the collectors.

If the situation is as shown in FIG. 2, i.e. the base of transistor $T_2$ connected to the supply line 7, transistor $T_2$ is in the non-conducting state and carries no current. As a result, there will be no current through diode $D_2$ and transistor $T_6$ will be in the non-conducting state. When a signal voltage $Vi_1$ is applied between the base of transistor $T_1$ and supply line 7, said signal voltage will appear almost fully across the impedance $Z_1$ owing to the emitter follower action of transistor $T_1$ and will produce a signal current equal to $Vi_1Z_1$ in said impedance. Said signal current flows through diode $D_1$. If in an integrated circuit diode $D_1$ takes the form of a transistor connected as a diode, said transistor being identical to transistor $T_5$, the collector current of transistor $T_5$ will be equal to said signal current. Said signal current then flows through the impedance $Z_2$, so that for the output signal voltage which is available at output terminal 5, the same relationship is valid for the input signal voltage as in equation (1). At output terminal 3 a signal voltage is available which complies with equation (2). In a similar way as in the device of FIG. 1, the complementary equation (3) is realized when switch 5 is set to the other position.

FIG. 3 shows an embodiment of a device according to the invention with an electronic switch 5 and with the impedances $Z_1$ and $Z_2$ shown in more detail. The impedances $Z_1$ and $Z_2$ then correspond to FIG. 6 of said U.S. Pat. No. 3,813,559.

In the device of FIG. 3, the emitter-follower transistors $T_1$ and $T_2$ are of the pnp conductivity type, whilst the current mirror transistors $T_3$ and $T_4$ are of the npn conductivity type. The electronic switch is formed by two transistors $T_7$ and $T_8$ with a common emitter resistor $R_6$. The base of transistor $T_8$ is connected to a reference voltage source $V_{ref}$ and the base of transistor $T_7$ constitutes a control input 8. The collectors of the transistors $T_7$ and $T_8$ are connected to the supply line 6 via the resistors $R_2$ and $R_5$ respectively. These resistors $R_2$ and $R_5$ are respectively connected in parallel with the series connection of the resistor $R_3$ and the base-emitter junction of transistor $T_{10}$ and the series connection of resistor $R_4$ and the base-emitter junction of transistor $T_9$. The collectors of the transistors $T_9$ and $T_{10}$ are connected to the base electrodes of the emitter follower transistors $T_1$ and $T_2$ respectively, which base electrodes are supplied with a bias voltage by means of the voltage dividers $R_9$, $R_{10}$ and $R_{11}$, $R_{12}$ respectively.

If the voltage at the base of transistor $T_7$ is greater than the reference voltage $V_{ref}$, transistor $T_7$ is conductive, whilst transistor $T_8$ is conductive if the voltage at the base of transistor $T_7$ is smaller than the reference voltage $V_{ref}$. If transistor $T_7$ is conducting, transistor $T_{10}$ is in the conducting state. The collector current of transistor $T_{10}$ produces such a high voltage across the resistor $R_{12}$ that transistor $T_2$ is turned off. In the similar way transistor $T_1$ is in the non-conducting state when transistor $T_8$ is conducting. Thus, the device is switchable with the aid of a control voltage at the base of transistor $T_7$.

The impedance $Z_1$ is constituted by a resistor $R_2$. The impedance $Z_2$ is constituted by the series connection of the resistor $R_7$, the collector-emitter path of transistor $T_{11}$ and the resistor $R_8$. The transistor $T_{11}$ has a collector-base negative feedback via an active network which in FIG. 3 is represented within the dashed block G. When it is assumed that transfer function of said network G is g, the impedance $Z_2$ will be:

$$Z_2 = R_7 + gR_8 \qquad (5)$$

The network G of FIG. 3 consists of a high-pass filter $F_1$, whose output signal is applied to the base of transistor $T_{11}$ via an amplifier $A_1$. Moreover, the amplitude of the output signal of amplifier $A_1$ is measured, in that said output signal is applied to a detector D via a second amplifier $A_1$. The output signal of said detector D is a measure of the amplitude of the output signal of amplifier $A_1$ and is applied to a non-linear filter $F_2$ with both a frequency and amplitude-dependent character. The output signal of said filter $F_2$ is applied to a control input of the filter $F_1$ so as to control the cut-off frequency. Thus, the network G provides frequency and amplitude-dependent negative feedback for transistor $T_{11}$, so that the impedance $Z_2$ has a frequency and amplitude dependent character, which is desirable for dynamic noise reduction systems. A detailed circuit arrangement of the network G is described in each of the cited Patents.

FIG. 4 shows an example of an application of a device according to the invention, represented by block 12, in a recording and/or playback apparatus, which illustrates an additional advantage of the use of a device according to the invention.

The first input terminal 1 of the device according to the invention 12 is connected to a recording amplifier 13, to which for example signals from a receiver, microphone or record player are applied. The second input terminal 2 is connected to a playback circuit 10 which comprises a playback head and associated electronic circuitry and which reads the signals on a record carrier and supplies them to the input terminal 2. The first output terminal 3 is connected to a playback amplifier 11 which amplifies the signal at the output terminal 3 and supplies it for example to a loudspeaker. The second output terminal 4 is connected to a recording circuit 9 which comprises a recording head and associated electronic circuitry. Said recording circuit 9 records the signal at the output terminal 4 on a suitable record carrier, in particular a magnetic tape. Furthermore, the device 12 comprises the supply terminals 6 and 7 and a control input 8 for controlling an electronic switch 5 as employed in the device of FIG. 3.

If the device of FIG. 3 is in the recording mode, the first emitter follower of the device according to the invention will be in the conducting state. A signal which is applied to the input terminal 1 by the recording amplifier 13 appears at the output terminal 4 modified in accordance with transfer function (1) and is recorded by the recording circuit 9. Simultaneously, the input signal appears unmodified at output terminal 3, so that during recording of signals the unmodified signals can be monitored via the playback amplifier 11, for which no additional circuits and switches are required.

When the device is in the playback mode, the second emitter follower is in the conducting state. The recording circuit 9 is then rendered inoperative and the playback circuit 10 reproduces a signal which is recorded on the record carrier. Said signal is applied to the input terminal 2 of the device 12 and appears at the output terminal 3, modified in accordance with the complementary transfer function (3). This output signal is amplified by the playback amplifier 11.

It is found that the device according to the invention may be included in a recording and playback apparatus without the use of switches. Mode selection can then be effected with the aid of a control signal. During recording an unmodified monitoring signal is automatically available, for which not a single switch need be reset. The device according to the invention may take the form of an integrated circuit, only 7 connection terminals being required, as appears from FIG. 4. Moreover, the device according to the invention may be incorporated in an integrated circuit together with for example amplifiers.

What is claimed is:

1. A device for optionally realizing two mutually complementary transfer functions comprising a first and a second impedance, a first and a second emitter follower circuit means for optionally applying an input voltage applied to said emitter follower circuits across the first and the second impedances respectively, a selection means for optionally maintaining one of the two emitter follower circuits in the conducting state, the two impedances being included in two separate signal circuits, and a current mirror arrangement means for selectively coupling the current which is produced in the associated impedance by the conducting emitter follower circuit to the other impedance.

2. A dynamic noise reduction system comprising a device as claimed in claim 1.

3. A device as claimed in claim 1, wherein the current mirror arrangement comprises a first and a second transistor of mutually the same conductivity type having base-emitter junctions coupled in parallel, the first and the second emitter follower circuits respectively comprise a third and a fourth transistor of a conductivity type opposite to the conductivity type of the first and the second transistors, the collectors of said third and fourth transistors being coupled to bases of the first and the second transistors, the emitters of said third and fourth transistors being coupled to the collectors of the first and the second transistors respectively, the bases of said third and fourth transistors being coupled to a first and second input terminal respectively, the emitters of said third and fourth transistors being coupled to a first and a second output terminal respectively, the first impedance being included in the common circuit of the emitter of the third transistor and the collector of the first transistor, the second impedance being included in the common circuit of the emitter of the fourth transistor and the collector of the second transistor, and the selection means selectively connects the base of one of the third and the fourth transistors in a current-blocking sense to a point of constant potential.

4. A device as claimed in claim 3 further comprising a recording amplifier having an output coupled to the first input terminal, a playback amplifier having an input coupled to the first output terminal, a recording circuit having an input coupled to the second output terminal, and a playback circuit having an output coupled to the second input terminal.

5. A device as claimed in claim 1, wherein the current mirror arrangement comprises a fifth and a sixth transistor of mutually the same conductivity type having base-emitter junctions shunted by a first and a second semiconductor junction respectively, the first and second emitter follower circuits respectively comprising third and fourth transistors of a conductivity type opposite to the conductivity type of the fifth and the sixth transistors, the collectors of said third and fourth transistor being coupled to the bases of the fifth and the sixth transistor respectively, the emitters of said third and fourth transistors being coupled to a first and a second output terminal respectively, the first impedance being included in the common circuit of the emitter of third transistor and the collector of the sixth transistor and the second impedance being included in the common circuit of the emitter of fourth transistor and the collector of the fifth transistor, and the selection means selectively connects the base of one of the third and the fourth transistor in a reverse sense to a point of constant potential.

6. A device as claimed in claim 5, further comprising a recording amplifier having an output coupled to the first input terminal, a playback amplifier having an input coupled to the first output terminal, a recording circuit having an input coupled to the second output terminal, and a playback circuit having an output coupled to the second input terminal.

* * * * *